(12) United States Patent
Kong et al.

(10) Patent No.: US 12,092,670 B2
(45) Date of Patent: Sep. 17, 2024

(54) MULTIBAND RESONANCE FREQUENCY TRACKING CIRCUIT AND METHOD APPLIED TO ULTRASONIC MACHINING

(71) Applicant: HANGZHOU DIANZI UNIVERSITY, Hangzhou (CN)

(72) Inventors: Yaguang Kong, Hangzhou (CN); Zhangping Chen, Hangzhou (CN); Xichao Tang, Hangzhou (CN); Hongbo Zou, Hangzhou (CN); Na Huang, Hangzhou (CN); Fan Zhang, Hangzhou (CN); Xiaodong Zhao, Hangzhou (CN); Honghuan Chen, Hangzhou (CN)

(73) Assignee: HANGZHOU DIANZI UNIVERSITY, Zhejiang (CN)

( * ) Notice: Subject to any disclaimer, the term of this patent is extended or adjusted under 35 U.S.C. 154(b) by 0 days.

(21) Appl. No.: 18/009,647

(22) PCT Filed: Oct. 21, 2021

(86) PCT No.: PCT/CN2021/125273
§ 371 (c)(1),
(2) Date: Dec. 9, 2022

(87) PCT Pub. No.: WO2023/060638
PCT Pub. Date: Apr. 20, 2023

(65) Prior Publication Data
US 2024/0053390 A1 Feb. 15, 2024

(30) Foreign Application Priority Data
Oct. 13, 2021 (CN) .......................... 202111191666.6

(51) Int. Cl.
*G01R 23/02* (2006.01)
*G01H 13/00* (2006.01)

(52) U.S. Cl.
CPC ............. *G01R 23/02* (2013.01); *G01H 13/00* (2013.01)

(58) Field of Classification Search
CPC ......... G01R 23/00; G01R 23/02; G01H 13/00
(Continued)

(56) References Cited

U.S. PATENT DOCUMENTS

| 4,271,371 A * | 6/1981 | Furuichi | B06B 1/0253 331/25 |
| 2005/0237125 A1* | 10/2005 | Hino | H03L 7/1072 331/179 |
| 2011/0159829 A1 | 6/2011 | Kasha et al. | |

FOREIGN PATENT DOCUMENTS

| CN | 110149056 A | 8/2019 |
| CN | 110702971 A | 1/2020 |

(Continued)

*Primary Examiner* — Hoai-An D. Nguyen
(74) *Attorney, Agent, or Firm* — MUNCY, GEISSLER, OLDS & LOWE, P.C.

(57) ABSTRACT

The present invention discloses a multiband resonance frequency tracking circuit applied to ultrasonic machining, including an output current-voltage phase difference direction detection circuit and a multiband resonance frequency tracking circuit, where a detection signal output end of the output current-voltage phase difference direction detection circuit is connected to a signal input end of the multiband resonance frequency tracking circuit. Through the foregoing technical solutions, in the present invention, a system detuning state is quickly determined by using a current-voltage phase difference direction detection signal outputted by a D flip-flop in a chip SN74HC74D, and a dead-time resistor between a 5th pin and a 7th pin in a chip EG3525 can be changed in a timely manner based on a detuning degree of a piezoelectric transducer, so as to change a system driving frequency to track a resonance frequency of the piezoelectric transducer and implement fast and accurate tracking.

10 Claims, 4 Drawing Sheets

(58) Field of Classification Search
USPC .................................. 324/76.11, 76.12, 76.19
See application file for complete search history.

(56) References Cited

FOREIGN PATENT DOCUMENTS

| | | | | | |
|---|---|---|---|---|---|
| CN | 210523014 | U | * | 5/2020 | ............... B06B 1/06 |
| CN | 111609921 | A | * | 9/2020 | ............. G01H 11/06 |
| CN | 113134155 | A | | 7/2021 | |
| CN | 113252977 | A | | 8/2021 | |
| CN | 114681014 | A | * | 7/2022 | ....... A61B 17/32006 |
| CN | 106021174 | B | * | 7/2023 | ............. A61B 17/32 |
| DE | 102018100960 | A1 | * | 7/2019 | ........... B06B 1/0207 |
| JP | 3026833 | B2 | * | 3/2000 | ......... A61F 9/00745 |

* cited by examiner

MULTIBAND RESONANCE FREQUENCY TRACKING CIRCUIT AND METHOD APPLIED TO ULTRASONIC MACHINING

TECHNICAL FIELD

The present invention relates to the field of ultrasonic machine tool technologies, and in particular, to a multiband resonance frequency tracking circuit and method applied to ultrasonic machining.

BACKGROUND

A piezoelectric transducer is a core component of an entire ultrasonic system. Under the excitation of an external high-frequency driving signal, the piezoelectric transducer produces vibration with a same frequency. When the driving signal has a frequency the same as an inherent frequency of the piezoelectric transducer, the piezoelectric transducer has a maximum output vibration amplitude. However, during ultrasonic machining, a resonance frequency of the piezoelectric transducer drifts due to a change in an acting force of an external load. Therefore, during ultrasonic machining, it is required to constantly adjust the frequency of the driving signal to track the resonance frequency of the piezoelectric transducer, so that the piezoelectric transducer can always output at the maximum amplitude and ensure a highest electromechanical conversion coefficient. Therefore, designing a stable, fast and accurate automatic resonance frequency tracking strategy is one of research hotspots in an ultrasonic machining system. However, in existing relatively mature technical methods, when the piezoelectric transducer is detuned, a speed of determining a direction of a forward resonance frequency is still not fast enough, and the determining of a detuning degree of the forward resonance frequency is not sensitive enough, making it impossible to track the resonance frequency in a timely manner. At present, methods for implementing resonance frequency tracking in the ultrasonic machining system mainly include an acoustic feedback method, a complex frequency tracking method, a maximum current method, an automatic frequency tracking method based on a fuzzy PI control strategy, etc. An implementation solution mostly similar to the present invention is a method for tracking a resonance frequency of a piezoelectric transducer by using a phase-locked loop method disclosed by Wei Qian et al. in 2018, in which a controller controls a frequency of a driving signal by detecting a phase difference between voltage and current signals of a piezoelectric transducer circuit. In the phase-locked loop technology, the phase difference between the voltage and current signals of the piezoelectric transducer circuit is determined by a phase detector, the phase difference is linearly converted into a voltage which is outputted to a filter for filtering, and then an output frequency is adjusted by a voltage-controlled oscillator.

However, the frequency adjustment of the phase-locked loop technology is limited in range. Different types of piezoelectric transducers have different resonance frequencies, which requires the adjustment of hardware parameters of the phase-locked loop to change a range of the output frequency. Therefore, the use of the phase-locked loop technology to implement resonance frequency tracking has the disadvantages such as poor flexibility, poor structure, and high costs. The complex frequency tracking method can accelerate resonance frequency tracking to some extent, but the complex frequency tracking method also has some disadvantages, that is, in this method, only a phase difference being zero is used to determine whether the resonance frequency is tracked, while the piezoelectric transducer actually has forward and reverse resonant frequencies, a forward resonance frequency $F_s$ and a reverse resonance frequency $F_p$ of the piezoelectric transducer have phases of zero, and in this case, the complex resonance frequency tracking strategy cannot be used to distinguish whether a tracked frequency is the positive resonance frequency or the reverse resonance frequency. The maximum current method for tracking a resonance frequency has the biggest disadvantage of slow tracking. When the load suddenly changes, the tracking of resonance frequency usually cannot keep up with the change of the load, and thus the maximum current method for tracking a resonance frequency is not suitable for an application scenario where the load suddenly changes violently. The resonance frequency tracking method based on a fuzzy PI strategy has the disadvantages that when impedance characteristics of the piezoelectric transducer change greatly under a load condition, fuzzy PI cannot be used to distinguish whether the tracked resonance frequency is the forward resonance frequency or the reverse resonance frequency because the fuzzy PI only takes a phase difference as a control signal.

SUMMARY

Based on the shortcomings of the prior art, the present invention provides a multiband resonance frequency tracking circuit and method applied to ultrasonic machining Through the division of different detuning states of a piezoelectric transducer during loading, the circuit quickly determines a resonance frequency tracking direction and tracking degree when the resonance frequency is lost, which greatly shortens a determining time during the loss of the resonance frequency and improves a capability of quickly and accurately tracking a forward resonance frequency.

To resolve the foregoing technical problems, the technical solution of the present invention is as follows:

A multiband resonance frequency tracking circuit applied to ultrasonic machining includes an output current-voltage phase difference direction detection circuit and a multiband resonance frequency tracking circuit, where a detection signal output end of the output current-voltage phase difference direction detection circuit is connected to a signal input end of the multiband resonance frequency tracking circuit, the signal input end of the multiband resonance frequency tracking circuit includes a PWM control chip U1, a resistor R1, a resistor R2, a resistor R3, a resistor R4, a resistor R5, a resistor R6, a resistor R8, a resistor R9, a resistor R10, a resistor R11, a resistor R12, a transistor Q1, a transistor Q2, a slide rheostat Rw1, an optocoupler U2, a capacitor C1, a capacitor C2, a capacitor C3, a capacitor C4, a capacitor C5, and a capacitor C6, and one end of the resistor R4 is connected to the detection signal output end of the output current-voltage phase difference direction detection circuit, and the other end of the resistor R4 is connected to one end of the resistor R3 and a base of the transistor Q1; the end of the resistor R3 is connected to the other end of R4, and the other end of the resistor R3 is connected to one end of R1 and an emitter of the transistor Q1; the other end of the resistor R1 is grounded; one end of the resistor R9 is connected to +3.3 V and one end of the capacitor C5, and the other end of the resistor R9 is connected to a $1^{st}$ pin of the optocoupler U2; the other end of the capacitor C5 is grounded; one end of the resistor R5 is connected to a 3$^{rd}$ pin of the optocoupler U2, and the other end of the resistor R5 is connected to a 7$^{th}$ pin of the PWM control chip U1; one end of the capacitor C6 is connected to a 5$^{th}$ pin of the PWM control chip U1, and the other end of the capacitor C6 is grounded; one end of the slide rheostat Rw1 is connected to a 6$^{th}$ pin of the PWM control chip U1, the other end of the slide rheostat Rw1 is connected to one end of the resistor R11, and the other end of the resistor R11 is grounded; one end of the capacitor C4 is connected to an 8$^{th}$ pin of the PWM control chip U1, and the other end of the capacitor C4 is grounded; one end of the resistor R12 outputs a level signal, and the other end of the resistor R12 is connected to a base of the transistor Q2; one end of the resistor R10 is connected to an emitter of the transistor Q2; one end of the capacitor C1 is connected to +12 V and a 13$^{th}$ pin and a 15$^{th}$ pin of the PWM control chip U1, and the other end of the capacitor C1 is grounded; one end of the resistor R2 is connected to a 2$^{nd}$ pin of the PWM control chip U1, and the other end of the resistor R2 is connected to +5.1 V and a 16$^{th}$ pin of the PWM control chip U1; a 1$^{st}$ pin of the PWM control chip U1 is grounded; one end of the capacitor C2 is connected to the 16$^{th}$ pin of the PWM control chip U1, and the other end of the capacitor C2 is grounded; one end of the capacitor C3 is connected to the 13$^{th}$ pin of the PWM control chip U1, and the other end of the capacitor C3 is grounded; a 12$^{th}$ pin of the PWM control chip U1 is grounded; one end of the resistor R6 is connected to a 10$^{th}$ pin of the PWM control chip U1; and one end of the resistor R8 is connected to a 9$^{th}$ pin of the PWM control chip U1.

Preferably, the other end of the resistor R5 is further connected to the resistor R7, and one end of the resistor R7 is connected to the 7$^{th}$ pin of the PWM control chip U1; the other end of the resistor R7 is connected to a 4$^{th}$ pin of the optocoupler U2 and one end of the capacitor C6; one end of the capacitor C6 is connected to the 5$^{th}$ pin of the PWM control chip U1, and the other end of the capacitor C6 is grounded.

Preferably, the PWM control chip U1 is a chip EG3525.

Preferably, the resistor R5 has a resistance value of 1 KΩ, and the resistor R7 has a resistance value of 100Ω.

Preferably, the output current-voltage phase difference direction detection circuit includes a flip-flop U3, a capacitor C7, a capacitor C8, a capacitor C9, and a resistor R13;

one end of the capacitor C7 is connected to a 1$^{st}$ pin of the flip-flop U3, and the other end of the capacitor C7 is grounded; one end of the resistor R13 is connected to the 1$^{st}$ pin of the flip-flop U3, and the other end of the resistor R13 is connected to +3.3 V; a voltage square wave signal is input to a 2$^{nd}$ pin of the flip-flop U3; a current square wave signal is input to a 3$^{rd}$ pin of the flip-flop U3; a 6$^{th}$ pin of the flip-flop U3 outputs a detection signal and is connected to one end of the resistor R4; a 7$^{th}$ pin of the flip-flop U3 is grounded; one end of the capacitor C8 is connected to a 14$^{th}$ pin of the flip-flop U3, and the other end of the capacitor C8 is grounded; one end of the capacitor C9 is connected to +3.3 V and the 14$^{th}$ pin of the flip-flop U3, and the other end of the capacitor C9 is grounded.

Preferably, the flip-flop U3 is a D flip-flop SN74HC74D.

The present invention further discloses a multiband resonance frequency tracking method applied to ultrasonic machining, including the following cyclic steps:

S1: starting a device, and causing a piezoelectric transducer to operate at a normal frequency;

S2: detecting, by an output current-voltage phase difference direction detection circuit, voltage and current signals of the piezoelectric transducer circuit in real time; and S3: driving, by the multiband resonance frequency tracking circuit and based on a detection result, the piezoelectric transducer to adjust a frequency.

Preferably, in step S2, a system detuning duration threshold is preset, and a maximum duration threshold is set to 5-20 ms.

Preferably, when in step S2, a system is detuned at a moment $t_2$, the output current-voltage phase difference direction detection circuit outputs a high level, and duration of output of a high level signal is within the duration threshold, step S3 is performed to drive the piezoelectric transducer to slightly increase the frequency, and return to step S2 after the adjustment; or when in step S2, the system is detuned at the moment $t_2$, the output current-voltage phase difference direction detection circuit outputs a low level, and duration of output of a low level signal is within the duration threshold, step S3 is performed to drive the piezoelectric transducer to slightly reduce the frequency, and return to step S2 after the adjustment.

Preferably, after the slight adjustment is completed, if in step S2, the high level continues to be outputted and the duration exceeds the duration threshold, the piezoelectric transducer is driven to greatly increase the frequency; or after the slight adjustment is completed, if in step S2, the low level continues to be outputted and the duration exceeds the duration threshold, the piezoelectric transducer is driven to greatly reduce the frequency.

The Present Invention has the Following Characteristics and Beneficial Effects:

Through the foregoing technical solutions, in the present invention, a system detuning state is quickly determined by using a current-voltage phase difference direction detection signal outputted by the D flip-flop in a chip SN74HC74D, and a dead-time resistor between a 5$^{th}$ pin and a 7$^{th}$ pin in the chip EG3525 can be changed in a timely manner based on the detuning degree of the piezoelectric transducer, to change the system driving frequency to track the resonance frequency of the piezoelectric transducer and implement fast and accurate tracking. A process for implementing functions of the circuit is simple and fast, which improves a capability of quickly and accurately tracking the forward resonance frequency of the piezoelectric transducer.

BRIEF DESCRIPTION OF DRAWINGS

To describe technical solutions in the embodiments of the present invention or in the prior art more clearly, accompanying drawings required in the description of the embodiments or the prior art are briefly described below. Obviously, the accompanying drawings in the following description illustrate only some of the embodiments of the present invention, and a person of ordinary skill in the art can further obtain other accompanying drawings based on these accompanying drawings without creative efforts.

DESCRIPTION OF EMBODIMENTS

It should be noted that the embodiments in the present invention and features in the embodiments may be combined with each other when no conflict occurs.

In descriptions of the present invention, it should be understood that, direction or position relationships indicated by terms "center", "longitudinal", "transverse", "upper", "lower", "front", "rear", "left", "right", "vertical", "horizontal", "top", "bottom", "inner", "outer", and the like are direction or position relationships based on the accompanying drawings, and are merely intended to facilitate the descriptions of the present invention and simplify the descriptions, rather than indicating or implying that a referred device or element must have a particular direction or be constructed or operated in a particular direction. Therefore, these terms cannot be construed as limiting the present invention. In addition, the terms "first", "second", and the like are used for descriptive purposes only and cannot be construed as indicating or implying relative importance or implying the quantity of indicated technical features. Therefore, the features defined with "first", "second", and the like may explicitly or implicitly include one or more of the features. In the description of the present invention, unless otherwise stated, "a plurality of" means two or more.

In the description of the present invention, it should be noted that, unless otherwise explicitly specified and limited, the terms, "mount", "connected", and "connect", should be broadly understood. For example, a connection may be a fixed connection, a detachable connection or an integral connection; or may be a mechanical connection or an electrical connection; or may be a direct connection, an indirect connection through an intermediate medium, or internal communication between two elements. For a person of ordinary skill in the art, the specific meanings of the foregoing terms in the present invention may be construed based on specific circumstances.

Embodiment 1

Figure 1:
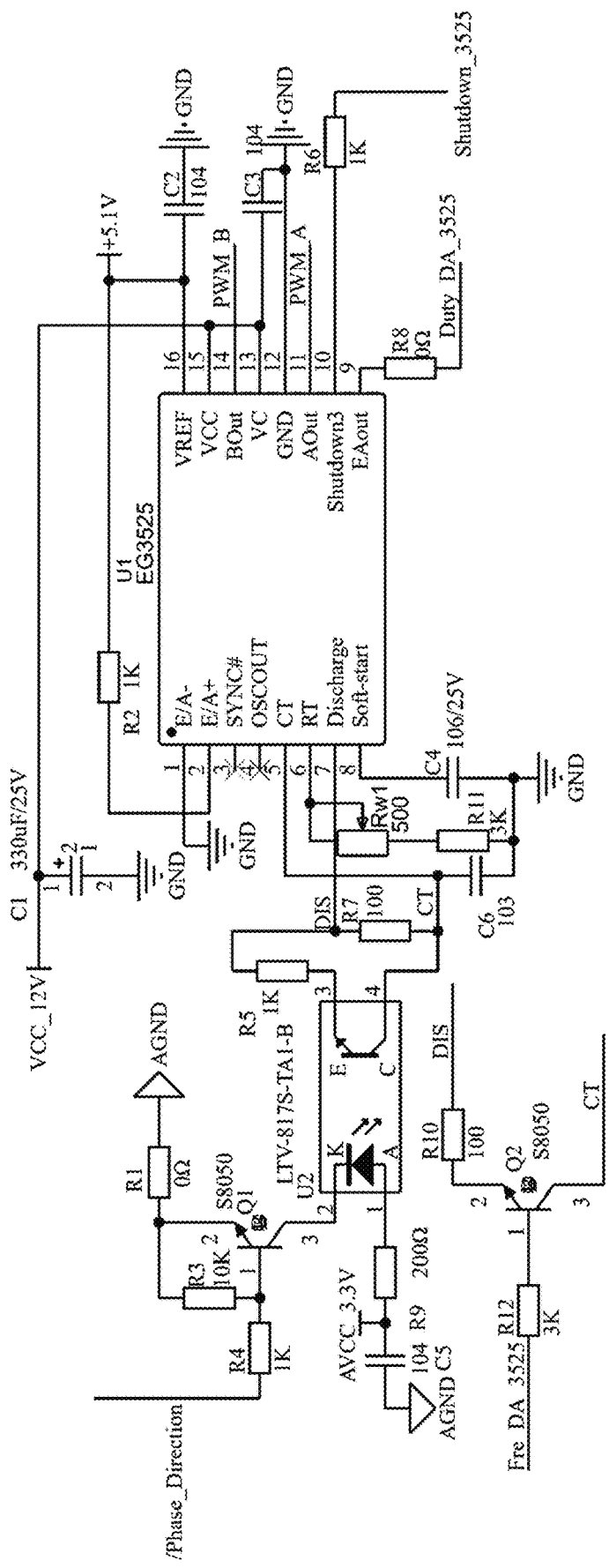
FIG. 1 is a diagram of a multiband resonance frequency tracking circuit in an embodiment of the present invention.

This embodiment provides a multiband resonance frequency tracking circuit applied to ultrasonic machining, as shown in FIG. 1, including an output current-voltage phase difference direction detection circuit and a multiband resonance frequency tracking circuit, where a detection signal output end of the output current-voltage phase difference direction detection circuit is connected to a signal input end of the multiband resonance frequency tracking circuit, the signal input end of the multiband resonance frequency tracking circuit includes a PWM control chip U1, a resistor R1, a resistor R2, a resistor R3, a resistor R4, a resistor R5, a resistor R6, a resistor R8, a resistor R9, a resistor R10, a resistor R11, a resistor R12, a transistor Q1, a transistor Q2, a slide rheostat Rw1, an optocoupler U2, a capacitor C1, a capacitor C2, a capacitor C3, a capacitor C4, a capacitor C5, and a capacitor C6, and one end of the resistor R4 is connected to the detection signal output end of the output current-voltage phase difference direction detection circuit, and the other end of the resistor R4 is connected to one end of the resistor R3 and a base of the transistor Q1; the end of the resistor R3 is connected to the other end of R4, and the other end of the resistor R3 is connected to one end of R1 and an emitter of the transistor Q1; the other end of the resistor R1 is grounded; one end of the resistor R9 is connected to +3.3 V and one end of the capacitor C5, and the other end of the resistor R9 is connected to a $1^{st}$ pin of the optocoupler U2; the other end of the capacitor C5 is grounded; one end of the resistor R5 is connected to a $3^{rd}$ pin of the optocoupler U2, and the other end of the resistor R5 is connected to a $7^{th}$ pin of the PWM control chip U1; one end of the capacitor C6 is connected to a $5^{th}$ pin of the PWM control chip U1, and the other end of the capacitor C6 is grounded; one end of the slide rheostat Rw1 is connected to a $6^{th}$ pin of the PWM control chip U1, the other end of the slide rheostat Rw1 is connected to one end of the resistor R11, and the other end of the resistor R11 is grounded; one end of the capacitor C4 is connected to an $8^{th}$ pin of the PWM control chip U1, and the other end of the capacitor C4 is grounded; one end of the resistor R12 outputs a level signal, and the other end of the resistor R12 is connected to a base of the transistor Q2; one end of the resistor R10 is connected to an emitter of the transistor Q2; one end of the capacitor C1 is connected to +12 V and a $13^{th}$ pin and a $15^{th}$ pin of the PWM control chip U1, and the other end of the capacitor C1 is grounded; one end of the resistor R2 is connected to a $2^{nd}$ pin of the PWM control chip U1, and the other end of the resistor R2 is connected to +5.1 V and a $16^{th}$ pin of the PWM control chip U1; a $1^{st}$ pin of the PWM control chip U1 is grounded; one end of the capacitor C2 is connected to the $16^{th}$ pin of the PWM control chip U1, and the other end of the capacitor C2 is grounded; one end of the capacitor C3 is connected to the $13^{th}$ pin of the PWM control chip U1, and the other end of the capacitor C3 is grounded; a $12^{th}$ pin of the PWM control chip U1 is grounded; one end of the resistor R6 is connected to a $10^{th}$ pin of the PWM control chip U1; and one end of the resistor R8 is connected to a $9^{th}$ pin of the PWM control chip U1. The PWM control chip U1 is a chip EG3525.

Further, the other end of the resistor R5 is further connected to the resistor R7, and one end of the resistor R7 is connected to the $7^{th}$ pin of the PWM control chip U1; the other end of the resistor R7 is connected to a $4^{th}$ pin of the optocoupler U2 and one end of the capacitor C6; one end of the capacitor C6 is connected to the $5^{th}$ pin of the PWM control chip U1, and the other end of the capacitor C6 is grounded. The resistor R5 has a resistance value of 1 KΩ, and the resistor R7 has a resistance value of 100Ω. It can be understood that one end of the resistor R4 is connected to the output current-voltage phase difference direction detection circuit, and is denoted as /Phase_Direction, and one end of the resistor R12 is connected to an MCU, and is denoted as Fre_DA_3525; a $14^{th}$ pin of the chip EG3525 is denoted as PWM A; one end of the resistor R6 is connected to a $10^{th}$ pin of the chip EG3525, and the other end thereof is denoted as Shutdown_3525; one end of the resistor R8 is connected to a $9^{th}$ pin of the chip EG3525, and the other end thereof is denoted as Duty_DA_3525.

In the foregoing technical solution, the multiband resonance frequency tracking circuit is mainly controlled by the chip EG3525, and the chip EG3525 is a relatively mature product, and has a built-in 5.1 V reference voltage source, 100-500 KHz wide frequency oscillator, soft start circuit, error amplifier, PWM comparator, under-voltage blocking circuit, power tube output driving circuit, etc. Through the adding of a resistor between a CT pin and a Discharge pin, a function of adjusting a dead time can be implemented. In addition, changes of external signals can drive the transistor to be turned on or off, thereby affecting a dead-time resistor between the $5^{th}$ pin and the $7^{th}$ pin in the chip EG3525, and changing frequencies of two paths of complementary PWM signals outputted, and power ultrasonic waves generated by an IGBT under the driving of PWM also changes.

Therefore, a key change factor in the circuit is the dead-time resistor between the $5^{th}$ pin and the $7^{th}$ pin in the chip EG3525. When a signal /Phase_Direction is at a high level, the transistor Q1 is turned on, and by using the optocoupler U2, a dead-time resistor between the $5^{th}$ pin and the $7^{th}$ pin of the chip EG3525 is connected in parallel with a 1 KΩ resistor. A total resistance value decreases slightly, a CT discharge time decreases, and the frequency changes slightly by changing a duty cycle. Furthermore, an ultrasonic frequency is controlled by a voltage analog control signal Fre_DA_3525 outputted by an ARM. When Fre_DA_3525 is at a high level, the transistor Q2 is turned on, and the dead-time resistor between the $5^{th}$ pin and $7^{th}$ pin of the chip EG3525 is connected in parallel with a 100Ω resistor, so that the frequency changes greatly.

In addition, the chip EG3525 has a synchronous clock function, can operate in a master-slave mode, and can also be synchronized with a clock signal of an external system.

Therefore, in the foregoing technical solution, when a system is detuned in a small range, and a driving frequency is less than a system frequency, the signal /Phase_Direction is at a high level, and the driving frequency is slightly increased; when the driving frequency is greater than the system frequency, the signal /Phase_Direction is at a low level, and the driving frequency is slightly reduced. The operation is repeated based on this rule, and the frequency presents an overall stable state during frequency tracking. When the system is detuned in a large range, and the driving frequency is less than the system frequency, Fre_DA_3525 is at a high level, and the driving frequency is greatly increased; when the driving frequency is greater than the system frequency, the signal Fre_DA_3525 is at a low level, and the driving frequency is greatly reduced, and then presents an overall stable state in slight oscillation. Therefore, the driving frequency of the system is changed to track the resonance frequency of the piezoelectric transducer, so as to implement fast and accurate tracking.

Figure 2:
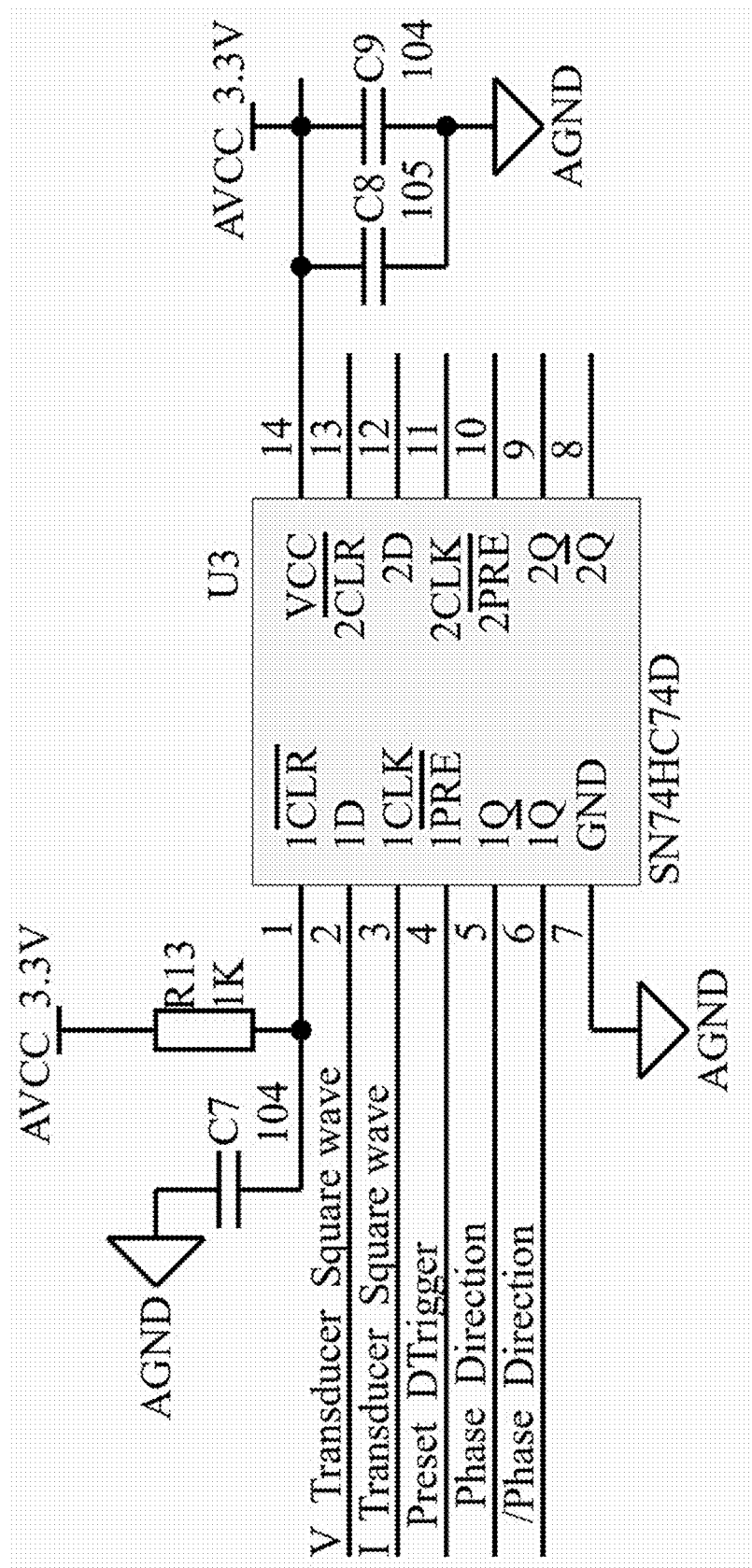
FIG. 2 is a diagram of an output current-voltage phase difference direction detection circuit in an embodiment of the present invention.

In a further arrangement of the present invention, as shown in FIG. 2, the output current-voltage phase difference direction detection circuit includes a flip-flop U3, a capacitor C7, a capacitor C8, a capacitor C9, and a resistor R13; and one end of the capacitor C7 is connected to a $1^{st}$ pin of the flip-flop U3, and the other end of the capacitor C7 is grounded; one end of the resistor R13 is connected to the $1^{st}$ pin of the flip-flop U3, and the other end of the resistor R13 is connected to +3.3 V; a voltage square wave signal is input to a $2^{nd}$ pin of the voltage square wave signal flip-flop U3; a current square wave signal is input to a 3rd pin of the flip-flop U3; a $6^{th}$ pin of the flip-flop U3 outputs a detection signal and is connected to one end of the resistor R4; a $7^{th}$ pin of the flip-flop U3 is grounded; one end of the capacitor C8 is connected to a $14^{th}$ pin of the flip-flop U3, and the other end of the capacitor C8 is grounded; one end of the capacitor C9 is connected to +3.3 V and the $14^{th}$ pin of the flip-flop U3, and the other end of the capacitor C9 is grounded. The flip-flop U3 is a D flip-flop SN74HC74D.

In the foregoing technical solution, the processing is performed mainly by using the D flip-flop. According to the operation principle of the D flip-flop, it can be understood that at a rising edge of a current signal, if the voltage signal is at a high level, a high level is outputted, and vice versa. When the voltage signal is at a high level at the rising edge of the current signal, it represents the current lags behind the voltage, and the piezoelectric transducer presents inductive characteristics in this case; or when the voltage signal is at a low level at the rising edge of the current signal, it represents the current is ahead of the voltage, and the piezoelectric transducer presents capacitive characteristics in this case.

Therefore, the output of the high level of the D flip-flop indicates that the piezoelectric transducer presents inductive characteristics, while the output of the low level of the D flip-flop indicates that the piezoelectric transducer presents capacitive characteristics. Therefore, the circuit takes a current square wave as a clock signal of the D flip-flop and a voltage square wave as an input, so as to obtain an output signal of the D flip-flop which can represent the impedance characteristics of the piezoelectric transducer.

Embodiment 2

Figure 3:
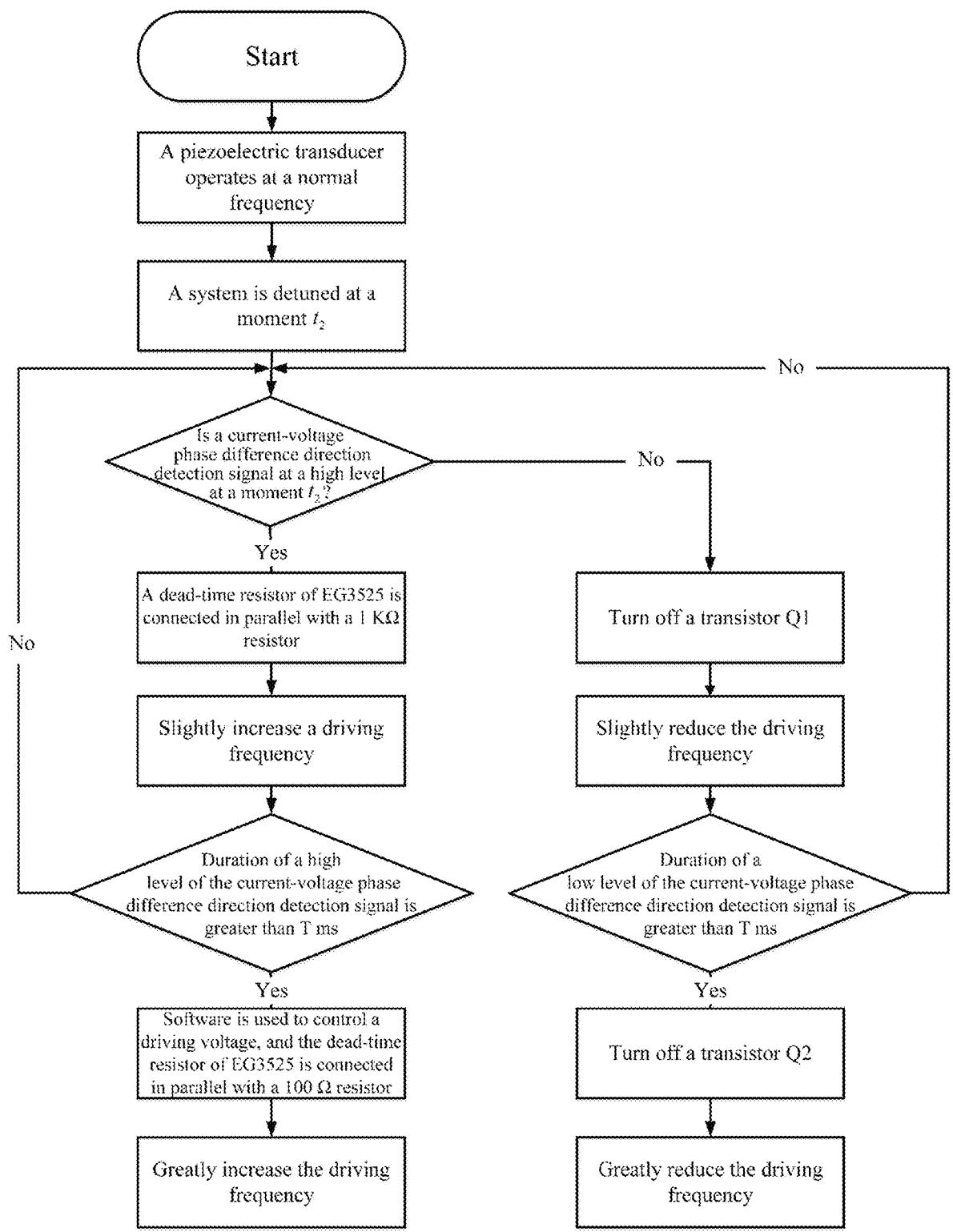
FIG. 3 is a schematic flowchart of a multiband synchronous resonance tracking method according to an embodiment of the present invention.

This embodiment discloses a multiband resonance frequency tracking method applied to ultrasonic machining, as shown in FIG. 3, including the following cyclic steps.

S1: A device is started, and a piezoelectric transducer operates at a normal frequency.

S2: An output current-voltage phase difference direction detection circuit detects voltage and current signals of the piezoelectric transducer circuit in real time.

S3: The multiband resonance frequency tracking circuit drives, based on a detection result, the piezoelectric transducer to adjust a frequency.

In the foregoing technical solution, it is assumed that an ultrasonic power supply operates normally at a driving signal frequency of f at a moment $t_1$, and the frequency tracking is good, but at a moment $t_2$, the piezoelectric transducer begins to be affected by the outside world, and its characteristics change.

Figure 4:
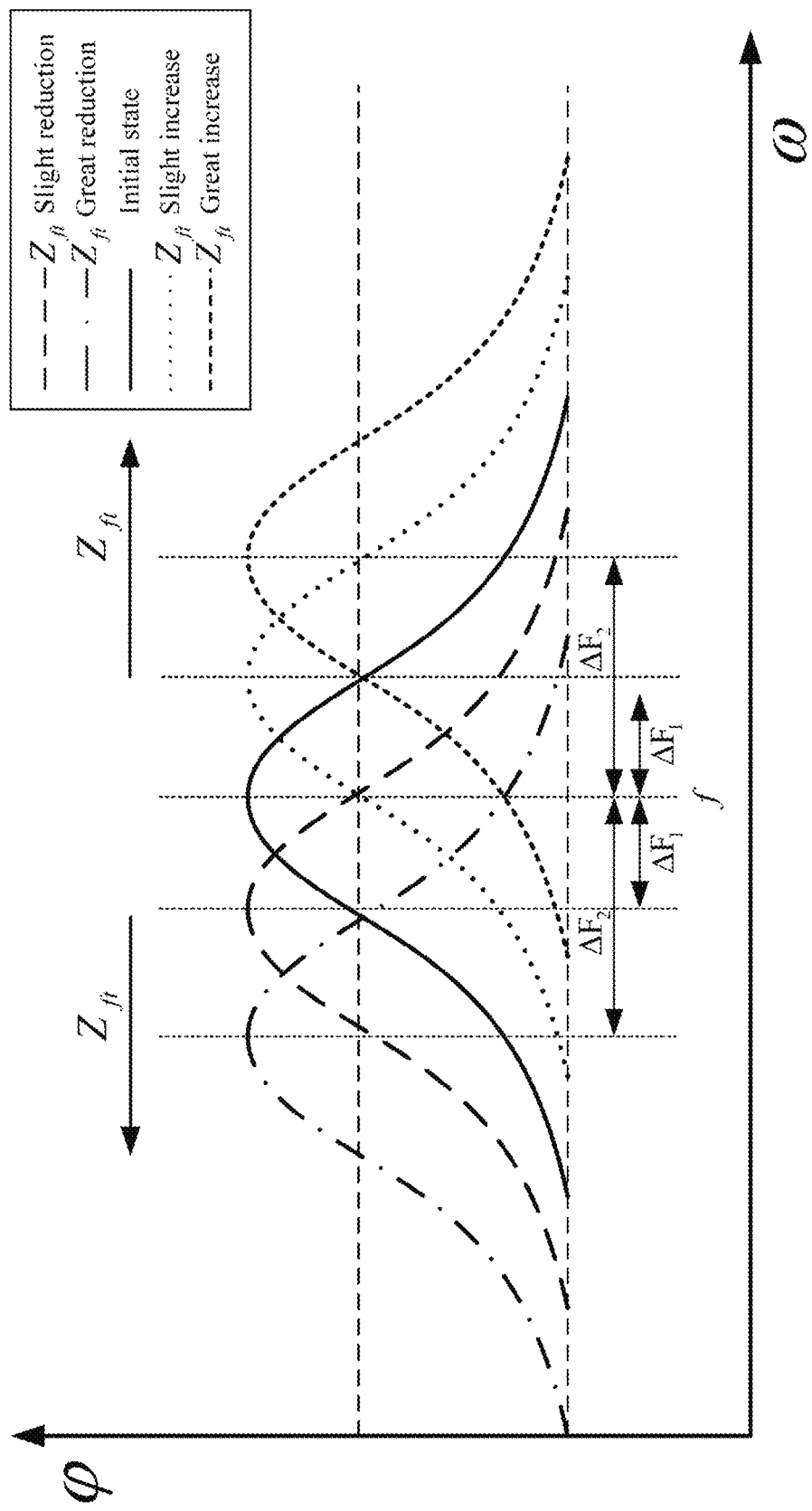
FIG. 4 is a schematic diagram of multiband resonance tracking according to an embodiment of the present invention.

At the moment $t_2$, when the system is detuned in a small range, as shown in the dotted line and dot-and-dash line in FIG. 4, the driving frequency is less than the system frequency, and the current-voltage phase difference direction detection signal outputted by the D flip-flop is at a high level, the transistor Q1 is turned on, the dead-time resistor of EG3525 is connected in parallel with the 1 KΩ resistor, and the driving frequency slightly increases.

When the driving frequency is greater than the system frequency, and the current-voltage phase difference direction detection signal outputted by the D flip-flop is at a low level, the transistor Q1 is turned off, and the driving frequency slightly decreases. The operation is repeated based on this rule, and the frequency presents an overall stable state during frequency tracking.

It can be understood that through real-time detection and synchronous adjustment, the driving frequency of the system is changed to track the resonance frequency of the piezoelectric transducer, so as to implement fast and accurate tracking, thereby ensuring normal operation of the system.

Further, in step S2, a system detuning duration threshold is preset, and a maximum duration threshold is set to 5 ms.

When in step S2, the system is detuned at a moment $t_2$, the output current-voltage phase difference direction detection circuit outputs a high level, and duration of output of a high level signal is within the duration threshold, step S3 is performed to drive the piezoelectric transducer to slightly increase the frequency, and return to step S2 after the adjustment.

Specifically, at the moment $t_2$, the current-voltage phase difference direction detection signal outputted by the D flip-flop is at a high level, and the duration is greater than 5 ms, which indicates that the system has a relatively large detuning degree. That is, as shown in FIG. 4, an initial state curve suddenly changes to a point-half-drawn line, and software is used to control the driving voltage to be at a high level. The transistor Q2 is turned on, and the dead-time resistor of EG3525 is connected in parallel with a 100Ω resistor, so that the driving frequency is greatly increased, and then presents an overall stable state in slight oscillation.

When in step S2, the system is detuned at the moment $t_2$, the output current-voltage phase difference direction detection circuit outputs a low level, and duration of output of a low level signal is within the duration threshold, step S3 is performed to drive the piezoelectric transducer to slightly reduce the frequency, and return to step S2 after the adjustment.

Specifically, at the moment $t_2$, the driving frequency is greater than the system frequency, the software is used to control the driving voltage to be at a low level, and the duration is greater than 5 ms, which indicates that the system has a relatively large detuning degree. That is, as shown in FIG. 4, an initial state curve suddenly changes to a half-drawn line, and the transistor Q2 is turned off, so that the driving frequency is greatly reduced, and then presents an overall stable state in slight oscillation.

In the foregoing technical solution, through the setting of the duration threshold, the detuning state can be further accurately determined, and then fast and accurate tracking is performed. This improves a capability of quickly and accurately tracking the forward resonance frequency of the piezoelectric transducer.

Embodiment 3

This embodiment differs from Embodiment 2 in that in step S2, a system detuning duration threshold is preset, and a maximum duration threshold is set to 20 ms.

In the foregoing technical solution, the maximum range of the duration threshold is set to 20 ms. Because there is enough time to monitor the level signal, a result of determining of the system detuning state is more accurate, an error rate of detuning determining is greatly reduced, then the adjustment is performed quickly, and then the frequency presents an overall stable state in slight oscillation.

The implementations of the present invention have been described above in detail with reference to the accompanying drawings, but the present invention is not limited to the described implementations. For a person skilled in the art, various changes, modifications, replacements, and alterations made to these implementations including components without departing from the principle and spirit of the present invention still fall within the protection scope of the present invention.

What is claimed is:

1. A multiband resonance frequency tracking circuit applied to ultrasonic machining, comprising an output current-voltage phase difference direction detection circuit and a multiband resonance frequency tracking circuit, wherein a detection signal output end of the output current-voltage phase difference direction detection circuit is connected to a signal input end of the multiband resonance frequency tracking circuit, the signal input end of the multiband resonance frequency tracking circuit comprises a PWM control chip U1, a resistor R1, a resistor R2, a resistor R3, a resistor R4, a resistor R5, a resistor R6, a resistor R8, a resistor R9, a resistor R10, a resistor R11, a resistor R12, a transistor Q1, a transistor Q2, a slide rheostat Rw1, an optocoupler U2, a capacitor C1, a capacitor C2, a capacitor C3, a capacitor C4, a capacitor C5, and a capacitor C6, and one end of the resistor R4 is connected to the detection signal output end of the output current-voltage phase difference direction detection circuit, and the other end of the resistor R4 is connected to one end of the resistor R3 and a base of the transistor Q1; the end of the resistor R3 is connected to the other end of the resistor R4, and the other end of the resistor R3 is connected to one end of the resistor R1 and an emitter of the transistor Q1; the other end of the resistor R1 is grounded; one end of the resistor R9 is connected to +3.3 V and one end of the capacitor C5, and the other end of the resistor R9 is connected to a $1^{st}$ pin of the optocoupler U2; the other end of the capacitor C5 is grounded; one end of the resistor R5 is connected to a $3^{rd}$ pin of the optocoupler U2, and the other end of the resistor R5 is connected to a $7^{th}$ pin of the PWM control chip U1; one end of the capacitor C6 is connected to a $5^{th}$ pin of the PWM control chip U1, and the other end of the capacitor C6 is grounded; one end of the slide rheostat Rw1 is connected to a $6^{th}$ pin of the PWM control chip U1, the other end of the slide rheostat Rw1 is connected to one end of the resistor R11, and the other end of the resistor R11 is grounded; one end of the capacitor C4 is connected to an $8^{th}$ pin of the PWM control chip U1, and the other end of the capacitor C4 is grounded; one end of the resistor R12 outputs a level signal, and the other end of the resistor R12 is connected to a base of the transistor Q2; one end of the resistor R10 is connected to an emitter of the transistor Q2; one end of the capacitor C1 is connected to +12 V and a $13^{th}$ pin and a $15^{th}$ pin of the PWM control chip U1, and the other end of the capacitor C1 is grounded; one end of the resistor R2 is connected to a $2^{nd}$ pin of the PWM control chip U1, and the other end of the resistor R2 is connected to +5.1 V and a $16^{th}$ pin of the PWM control chip U1; a $1^{st}$ pin of the PWM control chip U1 is grounded; one end of the capacitor C2 is connected to the $16^{th}$ pin of the PWM control chip U1, and the other end of the capacitor C2 is grounded; one end of the capacitor C3 is connected to the $13^{th}$ pin of the PWM control chip U1, and the other end of the capacitor C3 is grounded; a $12^{th}$ pin of the PWM control chip U1 is grounded; one end of the resistor R6 is connected to a $10^{th}$ pin of the PWM control chip U1; and one end of the resistor R8 is connected to a $9^{th}$ pin of the PWM control chip U1.

2. The multiband resonance frequency tracking circuit applied to ultrasonic machining according to claim 1, wherein the other end of the resistor R5 is further connected to the resistor R7, and one end of the resistor R7 is connected to the $7^{th}$ pin of the PWM control chip U1; the other end of the resistor R7 is connected to a $4^{th}$ pin of the optocoupler U2 and one end of the capacitor C6; one end of the capacitor C6 is connected to the $5^{th}$ pin of the PWM control chip U1, and the other end of the capacitor C6 is grounded.

3. The multiband resonance frequency tracking circuit applied to ultrasonic machining according to claim 1, wherein the PWM control chip U1 is a chip EG3525.

4. The multiband resonance frequency tracking circuit applied to ultrasonic machining according to claim 2, wherein the resistor R5 has a resistance value of 1 KΩ, and the resistor R7 has a resistance value of 100 Ω.

5. The multiband resonance frequency tracking circuit applied to ultrasonic machining according to claim 4, wherein the output current-voltage phase difference direction detection circuit comprises a flip-flop U3, a capacitor C7, a capacitor C8, a capacitor C9, and a resistor R13; and
one end of the capacitor C7 is connected to a $1^{st}$ pin of the flip-flop U3, and the other end of the capacitor C7 is grounded; one end of the resistor R13 is connected to the $1^{st}$ pin of the flip-flop U3, and the other end of the resistor R13 is connected to +3.3 V; a voltage square wave signal is input to a $2^{nd}$ pin of the flip-flop U3; a current square wave signal is input to a 3rd pin of the flip-flop U3; a $6^{th}$ pin of the flip-flop U3 outputs a detection signal and is connected to one end of the resistor R4; a $7^{th}$ pin of the flip-flop U3 is grounded; one end of the capacitor C8 is connected to a $14^{th}$ pin of the flip-flop U3, and the other end of the capacitor C8 is grounded; one end of the capacitor C9 is connected to +3.3 V and the $14^{th}$ pin of the flip-flop U3, and the other end of the capacitor C9 is grounded.

6. The multiband resonance frequency tracking circuit applied to ultrasonic machining according to claim 5, wherein the flip-flop U3 is a D flip-flop SN74HC74D.

7. A tracking method for the multiband resonance frequency tracking circuit applied to ultrasonic machining according to claim 6, comprising the following cyclic steps:
S1: starting a device, and causing a piezoelectric transducer to operate at a normal frequency;
S2: detecting, by an output current-voltage phase difference direction detection circuit, voltage and current signals of a piezoelectric transducer circuit in real time; and
S3: driving, by the multiband resonance frequency tracking circuit and based on a detection result, the piezoelectric transducer to adjust a frequency.

8. The tracking method for the multiband resonance frequency tracking circuit applied to ultrasonic machining according to claim 7, wherein in step S2, a system detuning duration threshold is preset, and a maximum duration threshold is set to 5-20 ms.

9. The tracking method for the multiband resonance frequency tracking circuit applied to ultrasonic machining according to claim 7, wherein when in step S2, system detuning occurs at a moment $t_2$, the output current-voltage phase difference direction detection circuit outputs a high level, and duration of output of a high level signal is within the duration threshold, step S3 is performed to drive the piezoelectric transducer to slightly increase the frequency, and return to step S2 after the adjustment; or
when in step S2, system detuning occurs at the moment $t_2$, the output current-voltage phase difference direction detection circuit outputs a low level, and duration of output of a low level signal is within the duration threshold, step S3 is performed to drive the piezoelectric transducer to slightly reduce the frequency, and return to step S2 after the adjustment.

10. The tracking method for the multiband resonance frequency tracking circuit applied to ultrasonic machining according to claim 9, wherein after the slight adjustment is completed, if in step S2, the high level continues to be outputted and the duration exceeds the duration threshold, the piezoelectric transducer is driven to greatly increase the frequency; or
after the slight adjustment is completed, if in step S2, the low level continues to be outputted and the duration exceeds the duration threshold, the piezoelectric transducer is driven to greatly reduce the frequency.

* * * * *